(12) United States Patent
Kondo

(10) Patent No.: US 10,476,508 B2
(45) Date of Patent: Nov. 12, 2019

(54) OSCILLATOR, ELECTRONIC APPARATUS, AND VEHICLE

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 237 days.

(21) Appl. No.: 15/631,857

(22) Filed: Jun. 23, 2017

(65) Prior Publication Data

US 2017/0373693 A1 Dec. 28, 2017

(30) Foreign Application Priority Data

Jun. 27, 2016 (JP) .................................. 2016-126626

(51) Int. Cl.
| | |
|---|---|
| *H03L 1/04* | (2006.01) |
| *H03H 9/08* | (2006.01) |
| *H03B 5/18* | (2006.01) |
| *H03H 9/02* | (2006.01) |
| *H03L 1/02* | (2006.01) |
| *H03B 5/12* | (2006.01) |

(52) U.S. Cl.
CPC ............. *H03L 1/04* (2013.01); *H03B 5/1203* (2013.01); *H03B 5/1847* (2013.01); *H03H 9/02102* (2013.01); *H03H 9/08* (2013.01); *H03L 1/028* (2013.01); *H01L 2224/48091* (2013.01); *H01L 2924/16195* (2013.01)

(58) Field of Classification Search
CPC ...... H03H 9/02102; H03H 9/08; H03L 1/028; H03L 1/04; H03B 5/1203; H03B 5/1847; H01L 2924/16195; H01L 2224/48091
USPC ...................... 331/158, 176, 68, 69; 310/343
See application file for complete search history.

(56) References Cited

U.S. PATENT DOCUMENTS

| | | | | |
|---|---|---|---|---|
| 7,023,291 B2* | 4/2006 | Kato | ...................... | G05D 23/19 331/158 |
| 2006/0237426 A1* | 10/2006 | Matsuoka | ................ | H03B 5/04 219/400 |
| 2015/0180445 A1* | 6/2015 | Isohata | .............. | H03H 9/02102 331/70 |

FOREIGN PATENT DOCUMENTS

| | | |
|---|---|---|
| JP | S62-003527 A | 1/1987 |
| JP | 2004-207870 A | 7/2004 |
| JP | 2006-295570 A | 10/2006 |

* cited by examiner

*Primary Examiner* — Arnold M Kinkead
(74) *Attorney, Agent, or Firm* — Oliff PLC

(57) ABSTRACT

An oscillator includes a first package, an oscillation element housed in the first package, a first temperature controller housed in the first package, a second package adapted to house the first package, and a second temperature controller disposed outside the first package, and housed in the second package.

17 Claims, 13 Drawing Sheets

OSCILLATOR, ELECTRONIC APPARATUS, AND VEHICLE

This application claims foreign priority to Japanese Patent Application No. 2016-126626 filed Jun. 27, 2016, which is hereby incorporated by reference herein in its entirety.

BACKGROUND

1. Technical Field

The present disclosure relates to an oscillator, an electronic apparatus, and a vehicle.

2. Related Art

As described in JP-A-2004-207870, in the past, there has been known an oven-controlled crystal oscillator (OCXO) as an oscillator using a crystal resonator element. The oscillator described in JP-A-2004-207870 includes an internal package for housing a resonator element and a heater, and an external package for housing the internal package.

However, the oscillator described in JP-A-2004-207870 includes only the heater disposed inside an insulating base of the internal package as the heater, and can therefore not sufficiently heat, for example, a resonator element housed in the internal package and the circuit components disposed outside the internal package, and there is a problem that the oscillator is easily affected by the external temperature fluctuation.

SUMMARY

An advantage of the disclosure is to provide an oscillator, an electronic apparatus, and a vehicle that are difficult to be affected by the external temperature fluctuation.

The disclosure can be implemented as the following application examples.

An oscillator according to an application example includes a first package, an oscillation element housed in the first package, a first temperature controller housed in the first package, a second package adapted to house the first package, and a second temperature controller disposed outside the first package, and housed in the second package. As described above, by providing the first temperature controller disposed in the first package, and the second temperature controller disposed in the second package, whereby the oscillator being affected by the external temperature fluctuation is hard.

In the oscillator according to the application example, it is preferable that the first package is mounted on the second package via the second temperature controller.

According to this application example, the heat of the second temperature controller can efficiently be transferred to the first package.

In the oscillator according to the application example, it is preferable that the first package includes a first base on which the first temperature controller and the oscillation element are mounted, and a first lid disposed so as to house the first temperature controller and the oscillation element between the first base and the first lid, and the first lid may be arranged to be located closer to the second temperature controller side than the first base.

Since the first lid is higher in degree of freedom of the material compared to the first base, by forming the first lid with a material high in thermal conductivity such as metal, it is possible to efficiently transfer the heat of the second temperature controller to the first package.

In the oscillator according to the application example, it is preferable that the first package includes a sealing ring located between the first base and the first lid, and adapted to bond the first base and the first lid to each other, and the sealing ring and the second temperature controller overlap each other in a planar view of the first package.

According to this application example, the heat of the second temperature controller can efficiently be transferred to the first base.

In the oscillator according to the application example, it is preferable that the two heating elements of the first temperature controller are disposed on respective sides opposite to each other with respect to a central part of the first package in a planar view of the first package.

According to this application example, the temperature variation in the first package can be reduced.

In the oscillator according to the application example, it is preferable that the oscillation element is disposed between the two heating elements of the first temperature controller in the planar view of the first package.

According to this application example, the oscillation element can efficiently be heated.

In the oscillator according to the application example, it is preferable that the two second temperature controllers are disposed on respective sides opposite to each other with respect to a central part of the first package in a planar view of the first package.

According to this application example, the temperature variation in the second package can be reduced.

In the oscillator according to the application example, it is preferable that the oscillation element is disposed between the two second temperature controllers in the planar view of the first package.

According to this application example, the oscillation element can be efficiently heated.

In the oscillator according to the application example, it is preferable that the two heating elements of the first temperature controller are disposed on respective sides opposite to each other with respect to a central part of the first package in a planar view of the first package, the two second temperature controllers are disposed on respective sides opposite to each other with respect to a central part of the first package in a planar view of the first package, and an arrangement direction of the two heating elements of the first temperature controller and an arrangement direction of the two second temperature controllers cross each other.

According to this application example, the oscillation element can be evenly heated.

In the oscillator according to the application example, it is preferable that the oscillation element is disposed between the two heating elements of the first temperature controller, and is disposed between the two second temperature controllers in the planar view of the first package.

Thus, the oscillation element can be evenly heated.

In the oscillator according to the application example, it is preferable that the first package and the second package are each airtightly sealed.

According to this application example, the oscillator being affected by the external temperature fluctuation becomes hard.

In the oscillator according to the application example, it is preferable to further include an interconnection substrate, and a flexible substrate adapted to support the second package, and connected to the interconnection substrate.

According to this application example, the reliability of the mechanical and electrical connection between the flexible substrate and the second package and between the interconnection substrate and the flexible sub e is improved.

In the oscillator according to the application example, it is preferable to further include a third package adapted to house the interconnection substrate, the flexible substrate, and the second package.

According to this application example, the second package can be protected. Further, for example, by setting the third package in a reduced-pressure state, thereby making the oscillator being affected by the external temperature fluctuation harder.

In the oscillator according to the application example, it is preferable to further include a pin electrically connected to the interconnection substrate, adapted to fix the interconnection substrate to the third package, and disposed so as to penetrate the third package.

According to this application example, the electrical connection to the outside becomes easy.

An electronic apparatus may include an oscillator according to any one of the application examples and/or preferential embodiments described above.

Accordingly, an electronic apparatus high in reliability can be obtained.

A vehicle according to this application example may include the oscillator according to any one of the application examples and/or preferential embodiments described above. Accordingly, a vehicle high in reliability can be obtained.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, an oscillator, an electronic apparatus, and a vehicle according to the disclosure will be described in detail based on the embodiments shown in the accompanying drawings.

First Embodiment

Figure 1:
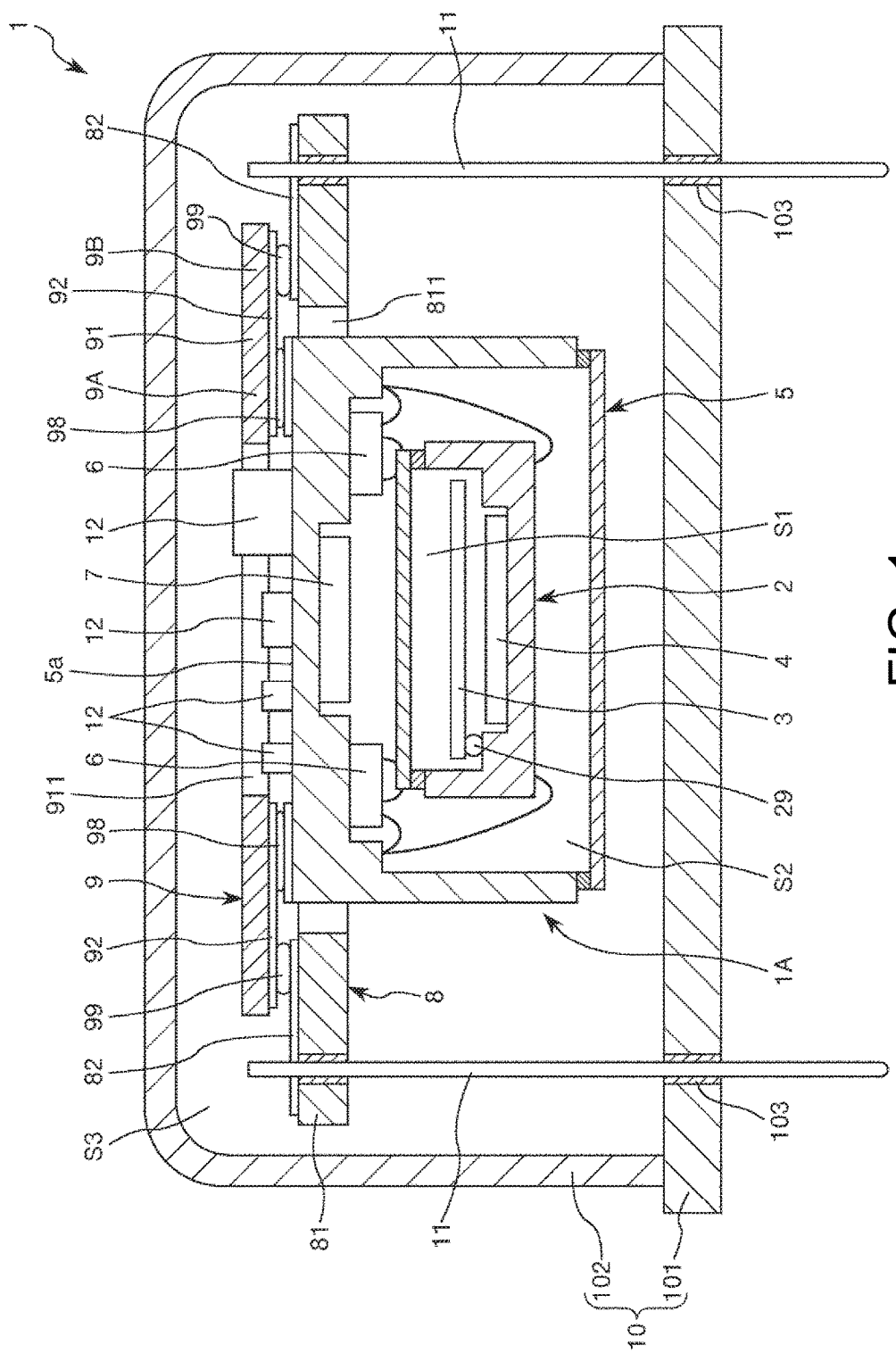
FIG. 1 is a cross-sectional view of an oscillator according to a first embodiment of the disclosure.
Figure 2:
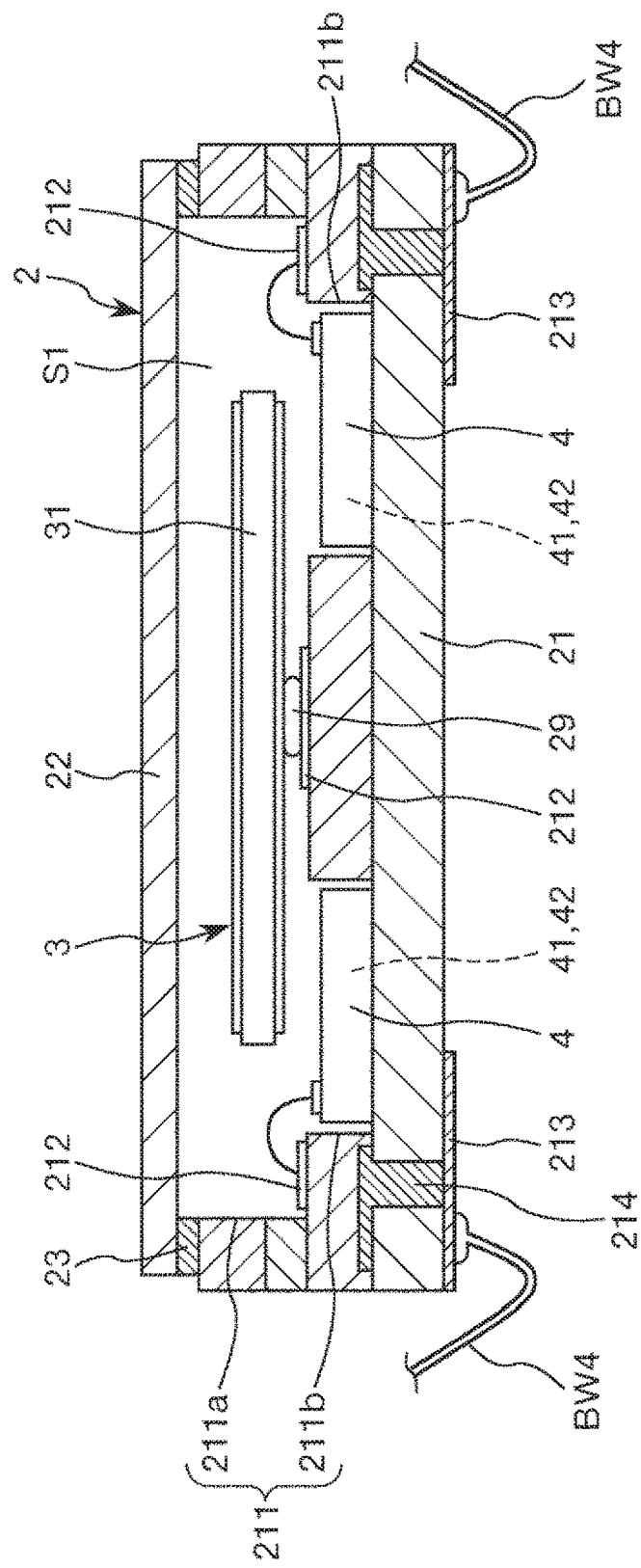
FIG. 2 is a cross-sectional view of a first package provided to the oscillator shown in FIG. 1.
Figure 3:
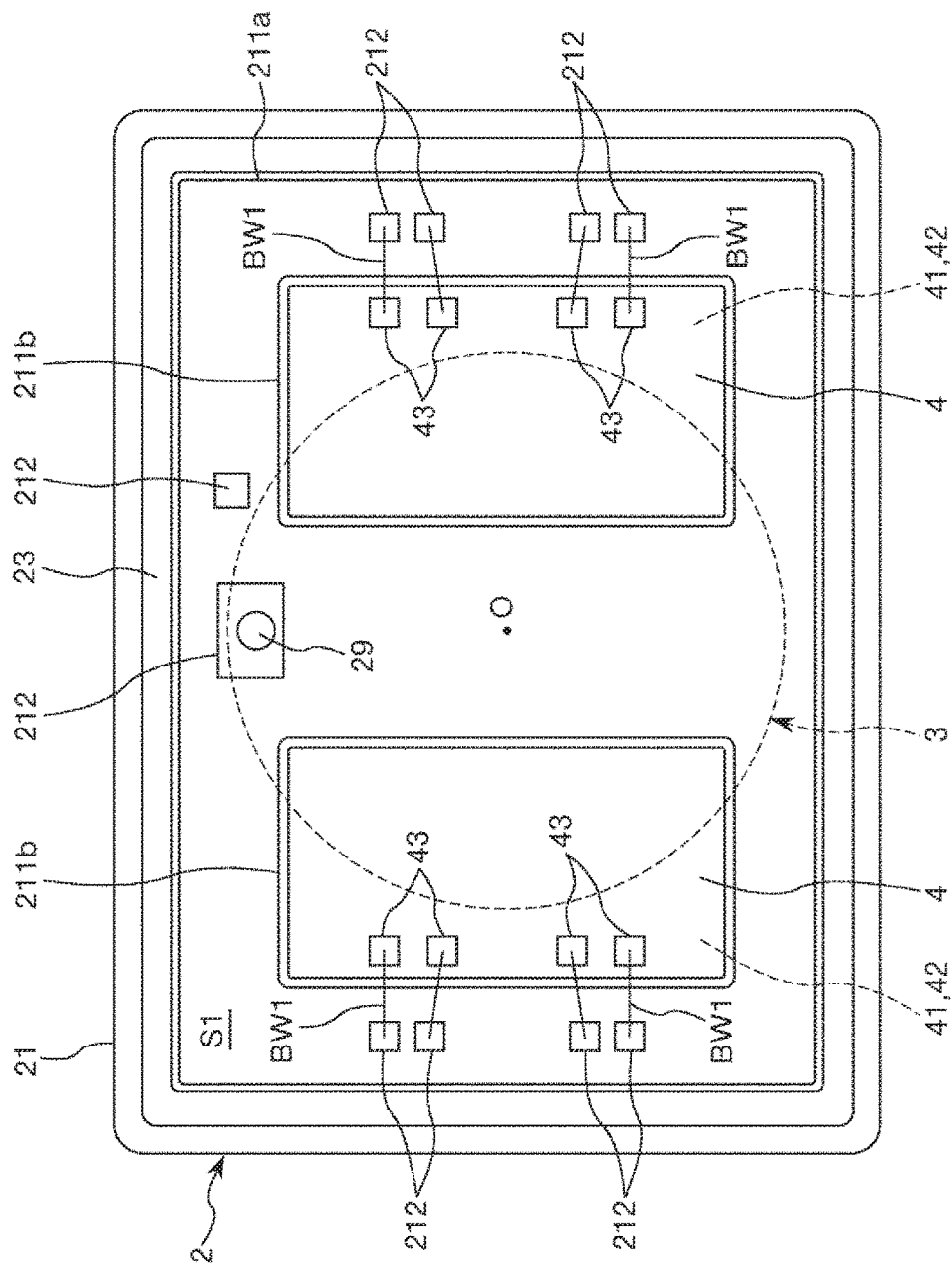
FIG. 3 is a plan view of the first package shown in FIG. 2.
Figure 4:
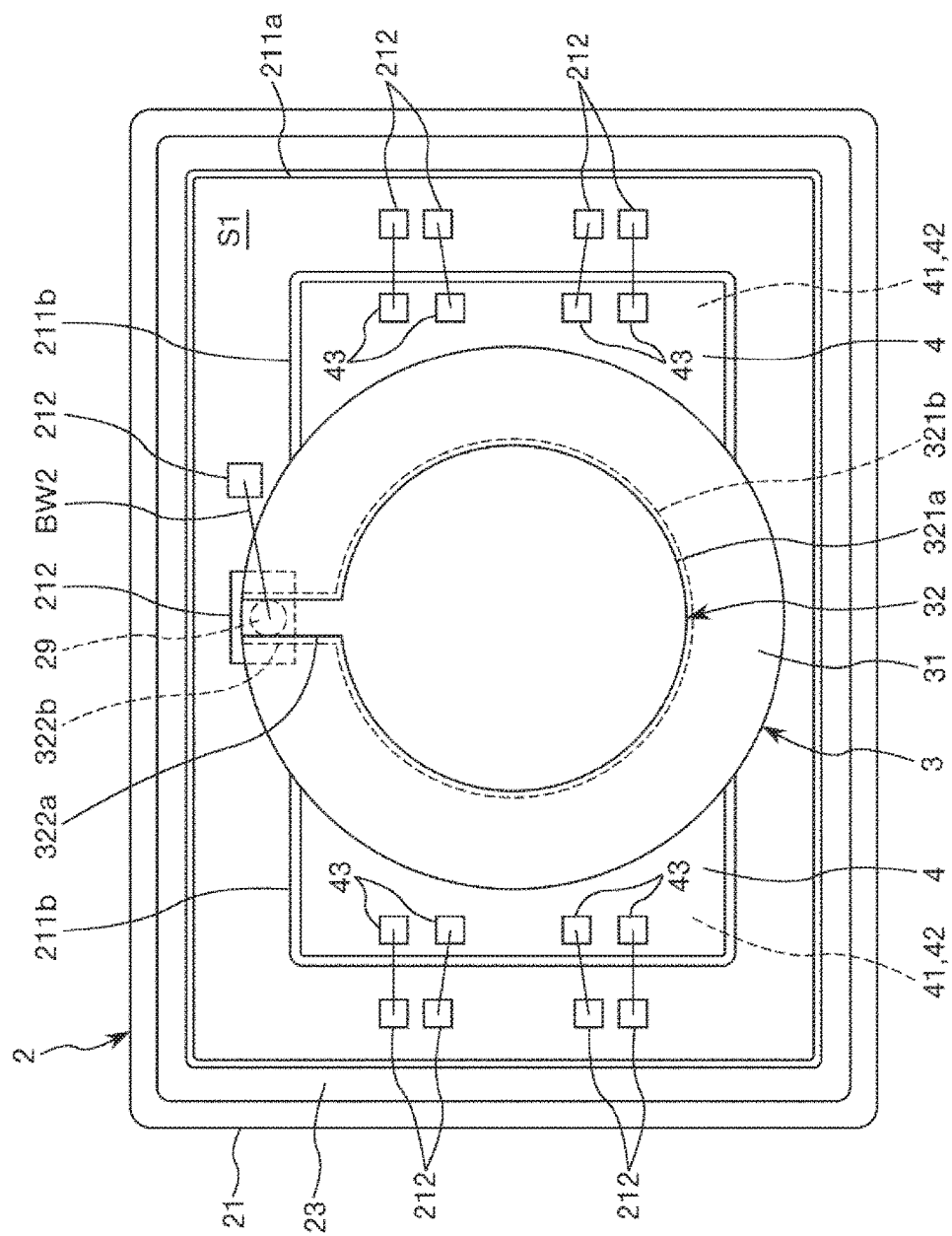
FIG. 4 is a plan view of the first package shown in FIG. 2.
Figure 5:
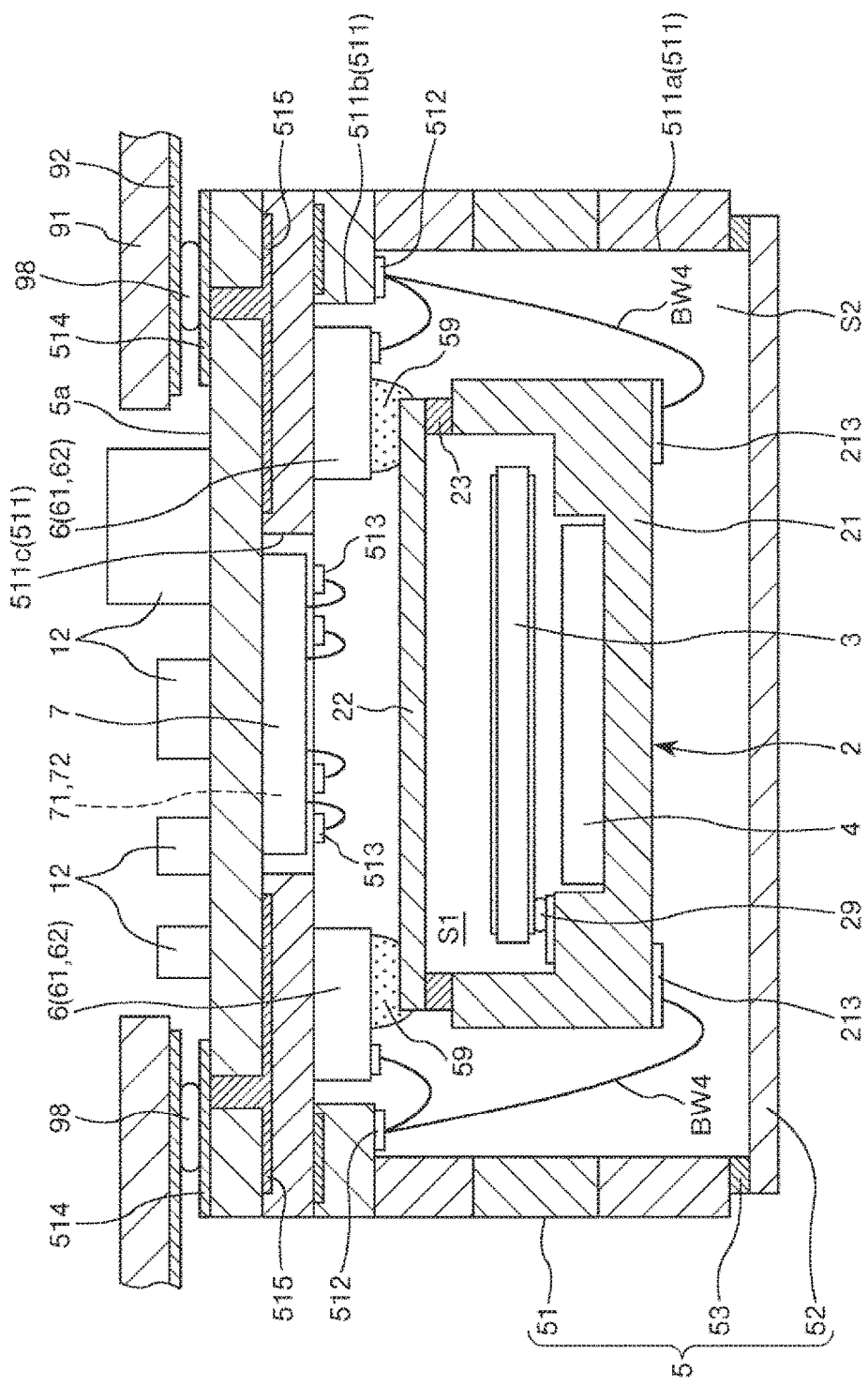
FIG. 5 is a cross-sectional view of a second package provided to the oscillator shown in FIG. 1.
Figure 6:
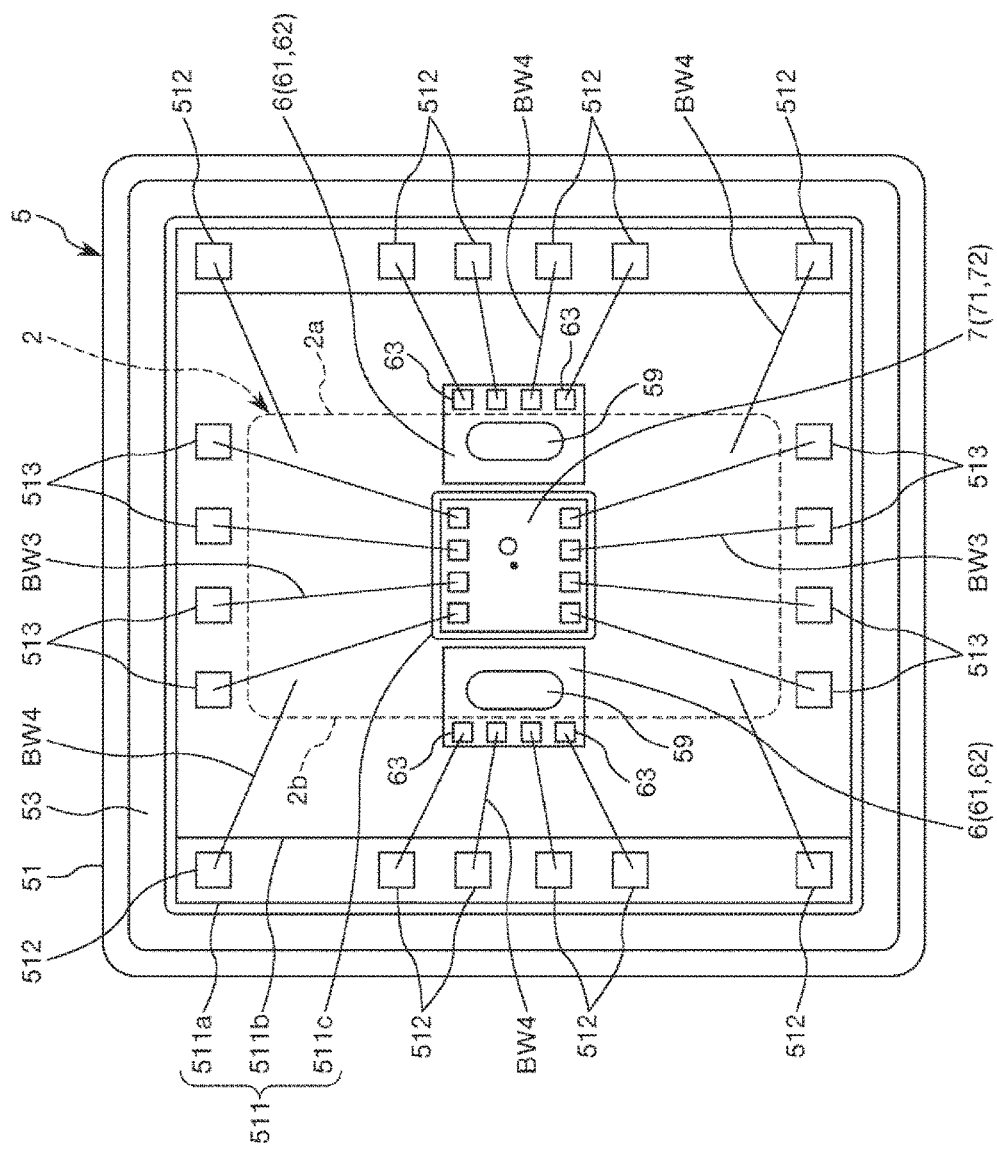
FIG. 6 is a plan view of the second package shown in FIG. 5.
Figure 7:
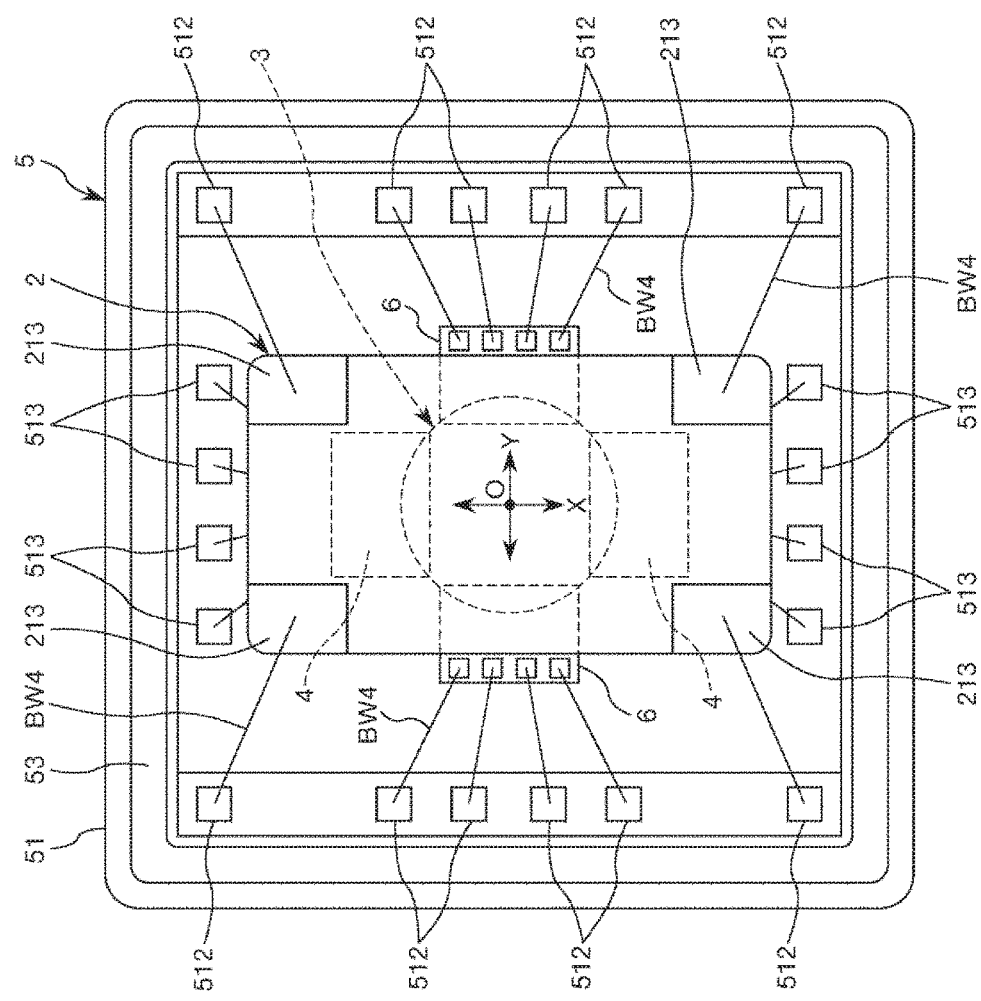
FIG. 7 is a plan view of the second package shown in FIG. 5.

FIG. 1 is a cross-sectional view of an oscillator according to a first embodiment of the disclosure. FIG. 2 is a cross-sectional view of a first package provided to the oscillator shown in FIG. 1. FIGS. 3 and 4 are each a plan view of the first package shown in FIG. 2. FIG. 5 is a cross-sectional view of a second package provided to the oscillator shown in FIG. 1. FIGS. 6 and 7 are each a plan view of the second package shown in FIG. 5. For the sake of convenience of explanation, the upper side of FIG. 1 is also referred to as an "upper side," and the lower side thereof is also referred to as a "lower side" in the following descriptions. Further, the planar view when viewing FIG. 1 from above is also referred to simply as a "planar view" below for the sake of convenience of explanation.

As shown in FIG. 1, the oscillator 1 is an OCXO (oven-controlled crystal oscillator). Such an oscillator 1 may include the first package 2, a resonator element 3 as an oscillation element housed in the first package 2, a first heating element(s) 4 as a first temperature controller housed in the first package 2, a second package 5 housing the first package 2, and a second heating element 6 as a second temperature controller disposed outside the first package 2 and housed in the second package 5. According to the oscillator 1 having such a configuration, it is possible to efficiently heat the resonator element 3 with the first heating element(s) 4 and the second heating element(s) 6. Further, it is also possible to heat the second package 5 with the second heating element 6. Therefore, it becomes possible to reduce the variation from a predetermined temperature of the resonator element 3, and thus, the oscillator 1 being hard to be affected by the external temperature fluctuation and being high in reliability is obtained. Hereinafter, such an oscillator 1 will be described in detail.

As shown in FIG. 1, the oscillator 1 may include the first package 2, the resonator element 3 and the first heating element 4 housed in the first package 2, the second package 5 housing the first package 2, the second heating element 6 and an integrated circuit (IC) element 7 both housed in the second package 5, circuit components 12 disposed on an upper surface 5a of the second package 5, an interconnection substrate 8, a flexible substrate 9 supporting the second package 5 and at the same time connected to the interconnection substrate 8, a third package 10 housing the interconnection substrate 8, the flexible substrate 9 and the second package 5, and pins 11, which are electrically connected to the interconnection substrate 8, and are disposed so as to fix the interconnection substrate 8 to the third package 10 and penetrate entirely or partially through the third package 10.

First Package

FIG. 2 is a cross-sectional view of the first package 2. As shown in FIG. 2, the first package 2 includes a first base member 21 on which the first heating element(s) 4 and the resonator element 3 are mounted, a first lid 22 disposed so as to house the first heating element(s) 4 and the resonator element 3 between the first base member 21 and the first lid 22, and a sealing ring 23 disposed between the first base member 21 and the first lid 22 to bond the first base member 21 and the first lid 22 to each other.

The first base member 21 may have a cavity shape having a recess 211 opening on the upper surface, and a roughly rectangular shape in a planar view as shown in FIG. 3. Further, the recess 211 may include a first recess 211a opening in the upper surface of the first base member 21, and two second recesses 211b opening on a bottom surface of the first recess 211a. Further, the two second recesses 211b may be arranged side by side in the longitudinal direction of the first base member 21, and may be disposed on respective sides opposite to each other with respect to the central part O of the first package 2 in a planar view of the first package 2.

In contrast, the first lid 22 may have a plate-like shape, and may be bonded to the upper surface of the first base member 21 via the sealing ring 23 so as to cover the opening of the recess 211. The sealing ring 23 may have a frame shape, and may be located between the upper surface of the first base member 21 and the first lid 22. Such a sealing ring 23 may be formed of a metal material, and when the sealing ring 23 melts, the first base member 21 and the first lid 22 are airtightly bonded to each other. As described above, a first housing space S1 may be created by covering the opening of the recess 211 with the first lid 22, and may house the resonator element 3 and the first heating element 4.

As discussed above, the first package 2 may be airtightly sealed, and the first housing space S1 may be in a reduced-pressure state (e.g., no higher than 10 Pa, or more preferably a vacuum state). Thus, it is possible to continue stable drive of the resonator element 3. Further, the first housing space S1 may functions as a heat-insulating layer, whereby it is harder to affect the oscillator 1 by the external temperature fluctuation. It should be noted that the atmosphere in the first housing space S1 is not particularly limited, but can be filled with an inert gas such as nitrogen or argon to be at the atmospheric pressure.

The constituent material of the first base 21 is not particularly limited, but a variety of types of ceramics such as aluminum oxide can be used. In this case, by calcining a stacked body of ceramic sheets (green sheets), the first base member 21 can be manufactured. Further, the constituent material of the first lid 22 is not particularly limited, but a member with a linear expansion coefficient similar to that of the constituent material of the first base member 21 is preferable. For example, in the case in which the ceramics described above are used as the constituent material of the first base member 21, an alloy such as Kovar may be preferably used.

Further, the first base member 21 may include a plurality of internal terminals 212 disposed on the bottom surface of the first recess 211*a*, and a plurality of external terminals 213 disposed on the bottom surface of the first base member 21. The internal terminals 212 may be electrically connected to the resonator element 3 and the first heating element(s) 4 via bonding wires BW1, BW2, respectively. Further, the internal terminals 212 may be electrically connected to the external terminals 213 via the internal interconnections 214 embedded in the first base member 21.

First Heating Elements

As shown in FIG. 3, the oscillator 1 may include two heating elements 4 disposed on the respective sides opposite to each other with respect to the central part O of the first package 2 in a planar view of the first package 2. Specifically, one of the first heating elements 4 may be fixed to the bottom surface of one of the second recesses 211*b* via an adhesive or the like, and the other of the first heating elements 4 may be fixed to the bottom surface of the other of the second recesses 211*b* via an adhesive or the like. These two first heating elements 4 may each be an electronic component having a so-called "constant-temperature function" for heating the resonator element 3 to keep the temperature of the resonator element 3 roughly constant. By heating the resonator element 3 with the first heating elements 4 to keep the temperature of the resonator element 3 roughly constant, it is possible to suppress the fluctuation of the frequency due to the temperature variation in the area outside of the oscillator (i.e., the usage environment of the oscillator, such as, in a vehicle), and thus, the oscillator 1 is able to realize excellent frequency stability. Preferably, the first heating elements 4 are controlled so that the temperature of the resonator element 3 approaches a peak temperature (e.g., roughly 70° C. through 100° C. although different by the specification) representing zero temperature coefficient. Thus, it is possible to exert more excellent frequency stability.

In particular, by disposing the two first heating elements 4 as in the present embodiment, it is possible to more strongly heat the resonator element 3. Further, by disposing the two first heating elements 4 on the respective sides opposite to each other with respect to the central part O, it is possible to reduce the temperature variation of the first package 2 and the resonator element 3, and thus, it is possible to accurately keep the temperature of the resonator element 3 constant.

Such first heating elements 4 each include, for example, a heating circuit 41 provided with a power transistor, and a temperature detection circuit 42 formed of a diode or a thermistor, so that the temperature of the heating circuit 41 may be controlled based on the output from the temperature detection circuit 42 to be able to keep the resonator element 3 constant in temperature. It should be noted that the configurations of the heating circuit 41 and the temperature detection circuit 42 are not particularly limited. For example, it is possible to make the temperature detection circuit 42 separate from the first heating elements 4.

Further, a plurality of terminals 43 may be disposed on the upper surface of each of the first heating elements 4, and these terminals 43 are electrically connected to the internal terminals 212 via respective bonding wires BW1.

Resonator Element

As shown in FIG. 4, the resonator element 3 may be disposed in the first housing space S1, and may be fixed to the internal terminals 212 disposed on the bottom surface of the first recess 211*a* of the first base 21 via the fixation member 29 having electrical conductivity. Such a resonator element 3 includes a quartz crystal substrate 31, and electrodes 32 disposed on the quartz crystal substrate 31.

The quartz crystal substrate 31 is what is obtained by shaping an SC-cut quartz crystal substrate into a roughly circular planar shape by etching, mechanical processing, and so on. By using the SC-cut quartz crystal substrate, it is possible to obtain the resonator element 3, which is small in frequency jump or rise in resistance due to a spurious vibration, and is stable in temperature characteristic. It should be noted that the planar shape of the quartz crystal substrate 31 is not limited to a circular shape, but can also be a nonlinear shape such as an elliptical shape or an oval shape, or can also be a linear shape such as a triangular shape or rectangular shape. It should be noted that by shaping the quartz crystal substrate 31 into a circular shape as in the present embodiment, symmetry of the quartz crystal substrate 31 is improved, and it is possible to effectively suppress the oscillation in sub-vibration (spurious vibration) mode.

The electrodes 32 include a first excitation electrode 321*a* and a first extraction electrode 321*b* disposed on the upper surface of the quartz crystal substrate 31, and a second excitation electrode 322*a* and a second extraction electrode 322*b* disposed on the lower surface of the quartz crystal substrate 31.

Such a resonator element 3 may be fixed to the internal terminals 212 disposed on the bottom surface of the first recess 211*a* via the fixation member 29 having electrical conductivity in the outer periphery of the resonator element 3. The fixation member 29 bonds the first base 21 and the resonator element 3 to each other, and at the same time, electrically connects the internal terminal 212 and the second extraction electrode 322b to each other, and further thermally connects the first base 21 and the resonator element 3 to each other. On the other hand, the first extraction electrode 321b may be electrically connected to the internal terminal 212 via the bonding wire BW2.

The fixation member 29 is not particularly limited providing both of electrical conductivity and a bonding property are provided, and there can be used, for example, a metal bonding material (e.g., a gold bump), an alloy bonding material (e.g., a bump made of a gold-tin alloy or solder), and an electrically-conductive adhesive (e.g., a polyimide series adhesive having metal particles such as silver filler dispersed).

As shown in FIG. 4, the resonator element 3 may be disposed between the two first heating elements 4 in a planar view of the first package 2. More specifically, the center of the resonator element 3 may be located between the two first heating elements 4 in the planar view of the first package 2. Further, the fixation member 29 may be disposed at a position where the distances from the two first heating elements 4 are roughly equal to each other. Therefore, it is possible to equally transfer the heat of the two first heating elements 4 to the resonator element 3, and thus, it is possible to efficiently and evenly heat the resonator element 3.

Further, the resonator element 3 may be disposed so as to partially overlap each of the first heating elements 4. Thus, the distance between the resonator element 3 and each of the first heating elements 4 can be decreased, and it is also possible to efficiently heat the resonator element 3 with the heat radiation from the first heating elements 4.

Second Package

As shown in FIG. 5, the second package 5 includes a second base 51 to which the second heating element 6 and the circuit element 7 are fixed, a second lid 52 bonded to the second base 51 so as to house the second heating element 6 and the circuit element 7 between the second base 51 and the second lid 52, and a sealing ring 53 disposed between the second base 51 and the second lid 52 to bond the second base 51 and the second lid 52 to each other.

The second base 51 has a cavity shape having a recess 511 opening on the lower surface, and has a roughly square shape in a planar view. Further, the recess 511 includes a first recess 511a opening on the lower surface of the second base 51, a second recess 511b opening on the bottom surface of the first recess 511a, a third recess 511c opening on the bottom surface of the second recess 511b. In contrast, the second lid 52 has a plate-like shape, and may be bonded to the lower surface of the second base 51 via the sealing ring 53 so as to cover the opening of the recess 511. The sealing ring 53 has a frame shape, and may be located between the lower surface of the second base 51 and the second lid 52. Such a sealing ring 53 may be formed of a metal material, and by the sealing ring 53 melting, the second base 51 and the second lid 52 are airtightly bonded to each other. As described above, a second housing space S2 may be created by covering the opening of the recess 511 with the second lid 52, and houses the second heating element 6, the circuit element 7 and the first package 2.

The second package 5 may be airtightly sealed, and the second housing space S2 may be in a reduced-pressure state (e.g., no higher than 10 Pa, or preferably a vacuum state). Thus, it is possible to make the second housing space S2 function as a heat-insulating layer, and the oscillator 1 is made harder to be affected by the external temperature fluctuation. It should be noted that the atmosphere in the second housing space S2 is not particularly limited.

The constituent material of the second base 51 may be not particularly limited, but a variety of types of ceramics such as aluminum oxide can be used. In this case, by calcining a stacked body of ceramic sheets (green sheets), the second base 51 can be manufactured. Further, the constituent material of the second lid 52 is not particularly limited, but a member with a linear expansion coefficient similar to that of the constituent material of the second base 51 is preferable. For example, in the case in which the ceramics described above is used as the constituent material of the second base 51, it is preferable to use a metal material (e.g., an alloy such as Kovar) as the second lid 52.

Further, the second base 51 includes a plurality of internal terminals 512 disposed on the bottom surface of the first recess 511a, a plurality of internal terminals 513 disposed on the bottom surface of the second recess 511b, and a plurality of external terminals 514 disposed on the bottom surface of the second base 51. The plurality of internal terminals 512 are electrically connected to the external terminals 213 of the first package 2 and the second heating elements 6 via bonding wires BW4, respectively, and the internal terminals 513 are electrically connected to the circuit element 7 via bonding wires BW3, respectively. Further, these internal terminals 512, 513 are electrically connected to each other via internal interconnections 515 embedded in the second base 51, or electrically connected to the external terminals 514.

Second Heating Elements

The oscillator 1 includes the two second heating elements 6 fixed to the bottom surface of the second recess 511b via an adhesive or the like. These two second heating elements 6 are each an electronic component having a so-called "constant-temperature function" for heating the resonator element 3 via the first package 2 and at the same time heating the circuit element 7 to keep the temperature of the resonator element 3 and the circuit element 7 roughly constant.

As described above, the oscillator 1 includes the first heating elements 4 besides the second heating elements 6 as the elements for heating the resonator element 3. As described above, by adopting a configuration of heating the resonator element 3 by the first heating elements 4 and the second heating elements 6, it is possible to more strongly heat the resonator element 3. Further, it is also possible to heat the second package 5 and the circuit element 7 mainly by the second heating elements 6. Therefore, even in the case in which the external temperature changes rapidly, the temperature of the resonator element 3 and the circuit element 7 can more surely be kept constant (in other words, the temperature fluctuation of the resonator element 3 and the circuit element 7 can be reduced). Since the resonator element 3 and the circuit element 7 each have a temperature-dependent characteristic (a property that the characteristic varying with the temperature), by keeping these elements constant in temperature, the frequency variation can effectively be suppressed, and the oscillator 1 having excellent frequency stability is obtained.

The two second heating elements 6 are disposed so that the circuit element 7 may be located between the two second heating elements 6 in a planar view of the first package 2. Therefore, it is possible to heat the circuit element 7 evenly from the both sides using the two second heating elements 6, and thus it is possible to more accurately keep the temperature of the circuit element 7 constant.

Such second heating elements 6 each include, for example, a heating circuit 61 provided with a power transistor, and a temperature detection circuit 62 formed of a diode or a thermistor, so that the temperature of the heating circuit 61 may be controlled based on the output from the temperature detection circuit 62 to be able to keep the circuit element 7 and the resonator element 3 constant in temperature similarly to the first heating elements 4. It should be noted that the configurations of the heating circuit 61 and the temperature detection circuit 62 are not particularly limited.

As shown in FIG. 6, a plurality of terminals 63 may be disposed on the upper surface of each of the second heating elements 6, and the terminals 63 are electrically connected to the internal terminals 512 via the bonding wires BW4, respectively.

To the lower surface of each of such two second heating elements 6, there may be fixed the first package 2 via a fixation member 59. In other words, the first package 2 may be mounted on the second package 5 via the second heating elements 6. As described above, by fixing the first package 2 to the second heating elements 6, it is possible to efficiently transfer the heat of the second heating elements 6 to the resonator 3 via the first package 2. Therefore, it becomes easy to keep the temperature of the resonator element 3 constant, and at the same time the power consumption can be reduced. Further, the first package 2 may be disposed so as to hold the circuit element 7 in the space with the second base 51, and at least a part of the circuit element 7 may be located between the first package 2 and the second base 51. Thus, it is possible to heat the circuit element 7 also by the second base 51 and the first package 2 heated by the second heating elements 6. Specifically, it is possible to heat the circuit element 7 from vertical and horizontal directions (from the horizontal directions by the two second heating elements 6, and from the vertical directions by the second base 51 and the first package 2). Therefore, the circuit element 7 can more efficiently and evenly be heated. In particular, in the present embodiment, since the entire area of the circuit element 7 may be located between the first package 2 and the second base 51, the advantage described above becomes more conspicuous.

Further, as shown in FIG. 5, the first package 2 may be disposed so that the first lid 22 may be located on the second heating elements 6 side of the first base 21, and may be fixed to the second heating elements 6 in the first lid 22. As described above, the first lid 22 can be formed of a metal material (an alloy such as Kovar), and the thermal conductivity can be raised to a level higher than that of the first base 21. Therefore, the heat of the second heating elements 6 can more efficiently be transferred to the first package 2. As described above, by directly heating the first lid 22 high in thermal conductivity using the second heating elements 6, the heat of the first lid 22 is stably and evenly transferred to the resonator element 3 via the first base 21. Therefore, the temperature of the resonator element 3 can more accurately be kept constant.

Further, as shown in FIG. 6, the two second heating elements 6 are disposed on the respective sides opposite to each other with respect to the central part O of the first package 2 in the planar view of the first package 2. By disposing the two second heating elements 6 in such a manner, it is possible to evenly heat the first package 2.

Further, as shown in FIG. 6, in the planar view of the first package 2, one of the second heating elements 6 may be disposed so as to overlap one long side 2a of the first package 2, and the other of the second heating elements 6 may be disposed so as to overlap the other long side 2b of the first package 2. Further, as shown in FIG. 5, in the planar view of the first package 2, the sealing ring 23 and the second heating elements 6 overlap each other. By adopting such an arrangement, the heat of the second heating elements 6 can efficiently be transferred to the first base 21 via the sealing ring 23. Therefore, the resonator element 3 can efficiently be heated.

Further, as shown in FIG. 7, the two second heating elements 6 are each disposed so as not to overlap the first heating elements 4 in the planar view of the first package 2. For example, if at least a part of the second heating elements 6 overlaps the first heating elements 4, there is a possibility that the first package 2 is excessively heated in the overlapping part, and there is a possibility that an excessive temperature variation (temperature gradient) occurs in the first package 2. If such a temperature variation occurs, there is a possibility that stable heating of the resonator element 3 is hindered. Therefore, it is not preferable for the temperature variation to occur. Therefore, by arranging the first heating elements 4 and the second heating elements 6 so as not to overlap each other as in the present embodiment, it is possible t stably heat the resonator element 3. It should be noted that the first heating elements 4 and the second heating elements 6 can be disposed so as to at least partially overlap each other.

Further, as shown in FIG. 7, the resonator element 3 may be disposed between the two second heating elements 6 in the planar view of the first package 2. More specifically, the center of the resonator element 3 may be located between the two second heating elements 6 in the planar view of the first package 2. Therefore, it is possible to roughly equally transfer the heat of the two second heating elements 6 to the resonator element 3, and thus, it is possible to more efficiently heat the resonator element 3. In particular, in the present embodiment, if combined with the arrangement of the first heating elements 4 described above, the resonator element 3 maybe disposed between the two first heating elements 4 and may be disposed between the two second heating elements 6 in the planar view of the first package 2. By disposing the resonator element 3 so as to be surrounded by the four heating elements 4, 6 as described above, it may be possible to more efficiently heat the resonator element 3.

Further, the arrangement direction X of the two first heating elements 4 and the arrangement direction Y of the two second heating elements 6 cross each other. Therefore, it is possible to heat the resonator element 3 from four direction in the planar view of the resonator element 3 with the two first heating elements 4 and the two second heating elements 6. Therefore, the resonator element 3 can more efficiently and evenly be heated. In particular, in the present embodiment, since the arrangement direction X of the first heating elements 4 and the arrangement direction Y of the second heating elements 6 are perpendicular to each other, and the four heating elements 4, 6 are arranged symmetrically about the center of the resonator element 3 (i.e., so that the distances in the planar view from the center of the resonator element 3 are equal to each other), the advantage described above becomes more conspicuous.

Circuit Element

As shown in FIG. 6, the circuit element 7 may be fixed to the bottom surface of the third recess 511c via an adhesive or the like. Further, the circuit element 7 may be located at roughly the center of the second package 5 in the planar view of the second package 5. Further, the circuit element 7 may be electrically connected to the internal terminals 513 via the bonding wires BW3. Such a circuit element 7 includes, for example, at least a part of an oscillation circuit 71 for oscillating the resonator element 3, and at least a part of a temperature control circuit 72 for controlling the operation of the heating circuit 41 of each of the first heating elements 4 based on the output of the temperature detection circuit 42, and controlling the operation of the heating circuit 61 of each of the second heating elements 6 based on the output of the temperature detection circuit 62. It should be noted that the temperature control circuit 72 may be arranged to be able to independently control the drive of the first and second heating elements 4, 6.

Circuit Components

The circuit components 12 are disposed on the upper surface (the bottom surface of the second base 51) 5a of the second package 5 as shown in FIG. 5. The. plurality of circuit components 12 maybe circuit constituent parts for constituting the oscillation circuit 71 and the temperature control circuit 72 together with the circuit element 7 in the second package 5. By disposing the circuit components 12 outside the second package 5 in such a manner, miniaturization of the second package 5 can be achieved, and the circuit element 7 and the resonator element 3 can more efficiently be heated by the second heating elements 6.

It should be noted that the circuit components 12 are not particularly limited, but there can be cited, for example, a resistor element, a capacitor element, and an inductor element. Some of these circuit components have temperature-dependent characteristics. Therefore, by disposing the circuit components 12 on the upper surface 5a of the second package 5, namely by disposing the circuit components 12 and the second heating elements 6 so as to be opposed to each other via the second base 51, it is possible to heat the circuit components 12 with the second heating elements 6, and thus it is possible to keep the temperature of the circuit components 12 roughly constant. Therefore, the frequency fluctuation can effectively be suppressed to obtain the oscillator 1 having excellent frequency stability.

Interconnection Board

The interconnection substrate 8 can be formed of a known rigid printed-wiring board, and as shown in FIG. 1, includes, for example, a base 81 as a hard substance, and interconnections 82 mounted on the base 8. Further, the base 81 may be provided with an opening 811, and in the opening 811, there may be disposed the second package 5.

Flexible Substrate

As shown in FIG. 1, the flexible substrate 9 supports the second package 5, and at the same time, may be connected to the interconnection substrate 8. The flexible substrate 9 and the second package 5 are fixed to each other via fixation members 98 having electrical conductivity, and the flexible substrate 9 and the interconnection substrate 8 are fixed to each other via fixation members 99 having electrical conductivity. Such a flexible substrate 9 can be formed of a known flexible printed-wiring board, and includes a sheet-like (film-like) base 91 having flexibility, and interconnections 92 disposed on the base 91.

The base 91 has a sheet-like shape, and includes a package mounting region 9A set in a central part of the bass 91, and an interconnection substrate connection region 9B set in an edge part. Further, the second package 5 may be mounted in the package mounting region 9A, and may be connected to the interconnection substrate 8 in the interconnection substrate connection region 9B. Further, the interconnections 92 are electrically connected to the respective external terminals 514 of the second package 5 via the respective fixation members 98 in the package mounting region 9A, and are electrically connected to the interconnections 82 via the respective fixation members 99 in the interconnection substrate connection region 9B. Such a flexible substrate 9 has flexibility, and can therefore be deformed in accordance with the thermal expansion of, for example, the second package 5 and the interconnection substrate 8. Therefore, it is hard for stress to be applied to the bond part between the flexible substrate 9 and the second package 5 or the interconnection substrate 8, and the reliability of the mechanical and electrical connection between the second package 5 and the flexible substrate 9, and between the interconnection substrate 8 and the flexible substrate 9 is improved. In particular, in the case of performing the temperature control of the resonator element 3 using the first and second heating elements 4, 6, since the temperature may be significantly different between the state in which the power is applied and the state in which the power is not applied, the deformation due to the thermal expansion increases compared to the oscillator not provided with the first and second heating elements 4, 6, and in such a case, the reliability can be exerted. Further, in the case in which an impact is applied, since the impact can be absorbed by the flexible substrate 9, the possibility of a damage of the resonator element 3 can be reduced.

Further, in the package mounting region 9A of the base 91, there may be formed an opening 911, and the circuit components 12 are disposed in the opening 911. By providing the opening 911, mounting of the circuit components 12 on the upper surface of the second package 5 may be prevented from being hindered. It should be noted that as the shape of the opening 911, it is possible to adopt a closed shape not opening on the side surface of the base 91, or an open shape opening on the side surface of the base 91.

Third Package and Pins

As shown in FIG. 1, the third package 10 houses a structure 1A constituted by the second package 5, the flexible substrate 9, and the interconnection substrate 8. By providing such a third package 10, the structure 1A can be protected.

The third package 10 includes a third base 101 having a plate shape, and a third lid 102 having a cap-like shape bonded to the third base 101, and the structure 1A may be housed in a third housing space S3 formed by these constituents. The third package 10 is airtightly sealed, and the third housing space S3 may be in a reduced-pressure state (no higher than 10 Pa, or preferably a vacuum state). Thus, it is possible to make the third housing space S3 function as a heat-insulating layer, and the oscillator 1 is made harder to be affected by the external temperature fluctuation. It should be noted that the atmosphere in the third housing space S3 is not limited to the above, but can be filled with an inert gas such as nitrogen or argon to be at the atmospheric pressure, or can be opened to the air.

It should be noted that the third base 101 and the third lid 102 can be formed of, for example, a metal material or a resin material.

Further, the third base 101 may be provided with a plurality of through holes, and in each of the through holes, there may be inserted a pin 11 having electrical conductivity. Each of the pins 11 may be formed of a hermetic terminal, and the gap between the through hole and the pin 11 may be airtightly sealed with a sealing material 103. Further, the pin 11 may be fixed to the third base 101 with the sealing material 103. Further, each of the pins 11 may be fixed to the interconnection substrate 8 at the upper end thereof, and fixes the structure 1A to the third package 10 in the state of being separated from the third package 10. Therefore, it becomes hard for the external heat to propagate to the structure 1A, and thus, the oscillator 1 hard to be affected by the external temperature fluctuation is obtained.

Further, the pins 11 are electrically connected to the interconnections 82 provided to the interconnection substrate 8. Since the lower end of each of the pins 11 may be exposed to the outside of the oscillator 1, it is possible to mechanically and electrically connect the oscillator 1 to an external device such as a mother board with ease via the lower end.

Second Embodiment

Figure 8:
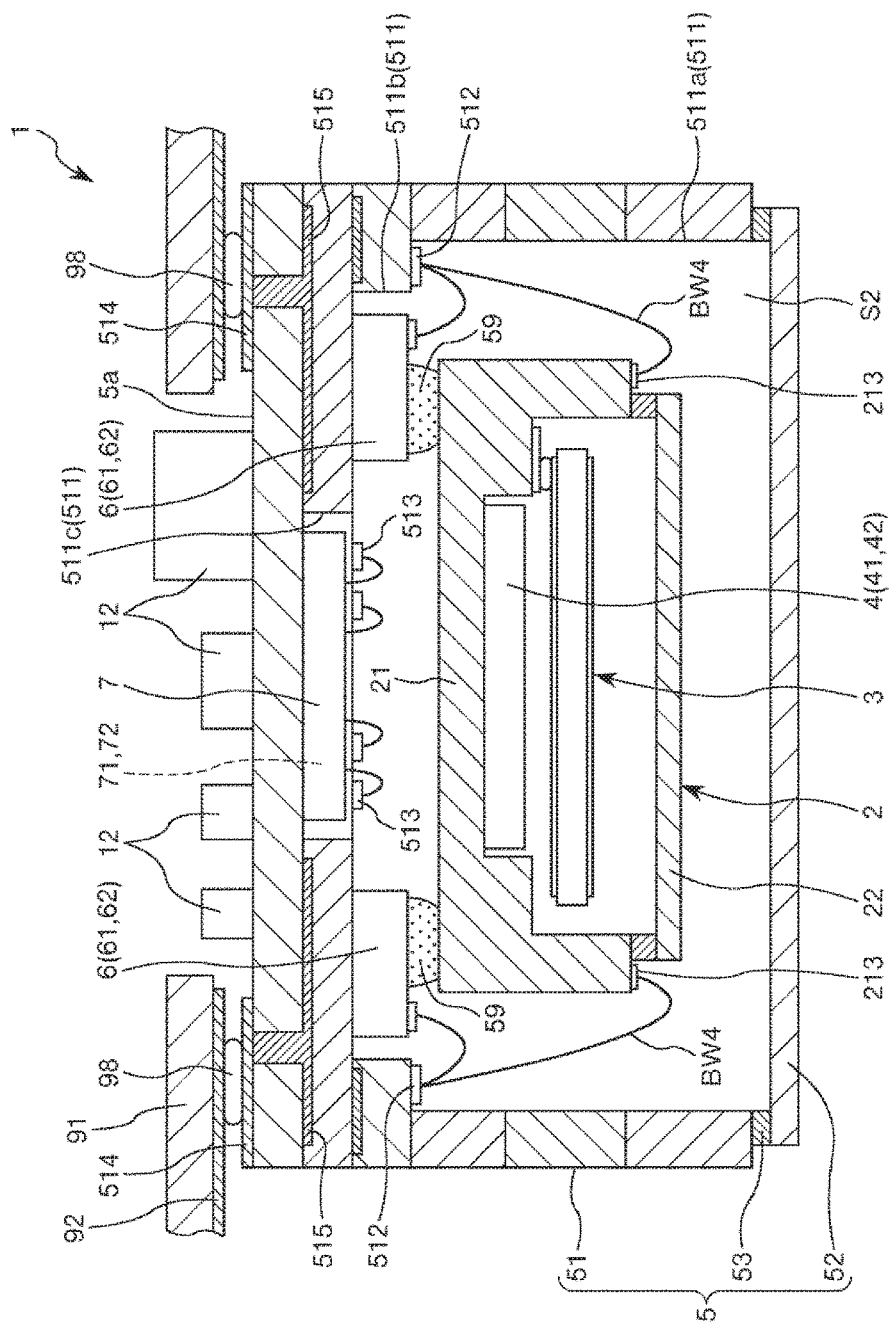
FIG. 8 is a cross-sectional view of an oscillator according to a second embodiment of the disclosure.

FIG. 8 is a cross-sectional view of an oscillator according to a second, embodiment of the invention.

The oscillator according to the second embodiment will hereinafter be described focusing mainly on the differences from the embodiment described above, and the description of substantially the same matters will be omitted.

The oscillator according to the second embodiment is substantially the same as the oscillator according to the first embodiment described above except mainly the point that the configuration of the first package may be different. It should be noted that in FIG. 8, the constituents substantially identical to those of the embodiment described above are denoted by the same reference symbols.

As shown in FIG. 8, in the oscillator 1 according to the present embodiment, the first package 2 may be fixed to the second heating elements 6 via the fixation members 59 on the bottom surface of the first base 21. In other words, in the oscillator 1 according to the present embodiment, the first package 2 may be disposed in a flipped manner compared to the configuration of the first embodiment described above. Thus, since the heat path from the second heating element 6 to the resonator element 3 can be made shorter compared to, for example, the first embodiment, it possible to more efficiently heat the resonator element 3.

It should be noted that due to such an arrangement, the external terminals 213 are disposed in a part located on the lower surface of the first base 21, and exposed from the first lid 22. By disposing the external terminals 213 in such as place, it is possible to easily wire-bond the external terminals 213 and the internal terminals 512 to each other.

According also to the second embodiment described hereinabove, substantially the same advantage as in the first embodiment described above can be obtained.

Third Embodiment

Figure 9:
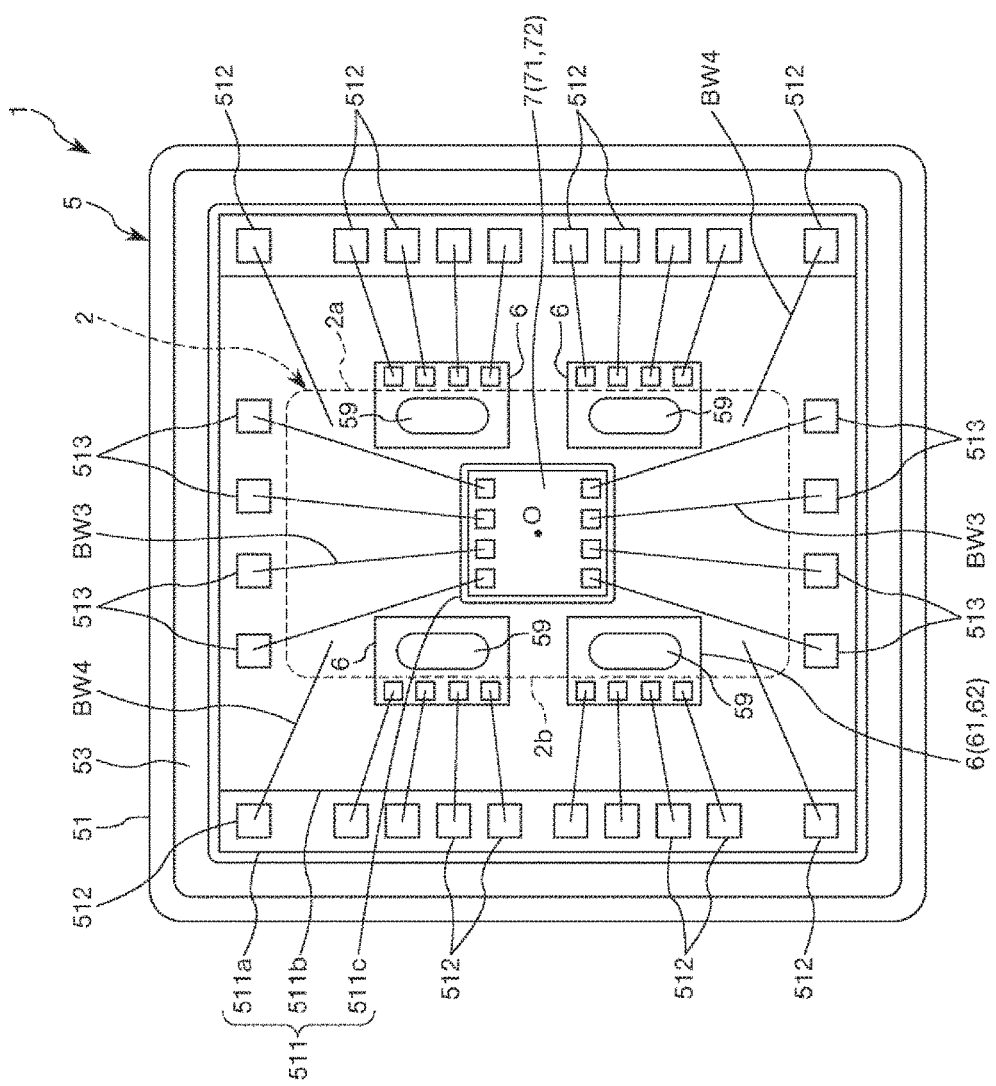
FIG. 9 is a plan view of an oscillator according to a third embodiment of the disclosure.

FIG. 9 is a plan view of an oscillator according to a third embodiment of the invention.

The oscillator according to the third embodiment will hereinafter be described focusing mainly on the differences from the embodiment described above, and the description of substantially the same matters will be omitted.

The oscillator according to the third embodiment may be substantially the same as the oscillator according to the first embodiment described above except mainly the point that the number of the second heating elements may be different. It should be noted that in FIG. 9, the constituents substantially identical to those of the embodiment described above are denoted by the same reference symbols.

As shown in FIG. 9, in the oscillator 1 according to the present embodiment, there are disposed four second heating elements 6. In a planar view of the first package 2, the four second heating elements 6 are arranged in a 2×2 matrix, and the two second heating elements 6 disposed on one side with respect to the central part O are disposed so as to overlap the one long side 2a of the first package 2, and the two second heating elements 6 disposed on the other side with respect to the central part O are disposed so as to overlap the other long side 2b of the first package 2. As described above, by arranging the four second heating elements 6, the resonator element 3 and the circuit element 7 can more strongly be heated compared to, for example, the case in which the number of the second heating elements 6 may be two as in the first embodiment described above.

According also to the third embodiment described hereinabove, substantially the same advantage as in the first embodiment described above can be obtained.

Electronic Apparatus

Then, an electronic apparatus equipped with the oscillator according to an embodiment of the disclosure will be described.

Figure 10:
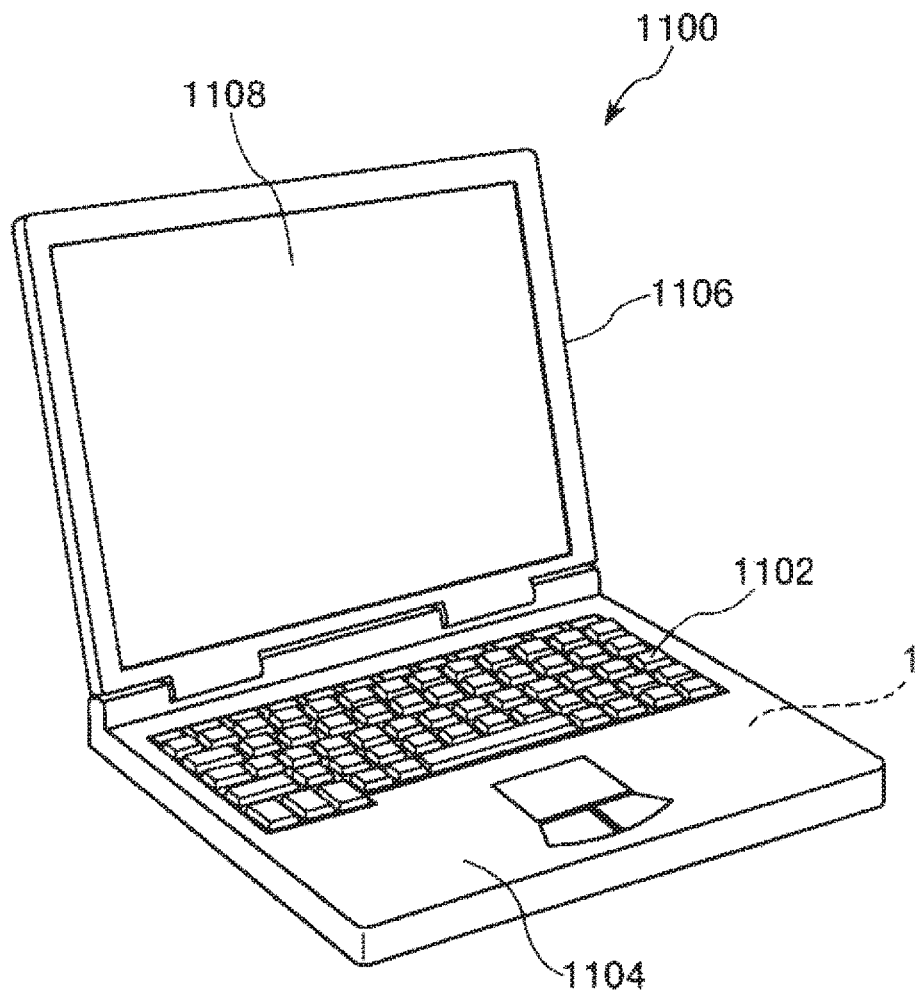
FIG. 10 is a perspective view showing a configuration of a mobile-type (or notebook-type) personal computer.

FIG. 10 is a perspective view showing a configuration of a mobile type (or a notebook type) personal computer as the electronic apparatus according to the invention.

In the drawing, the personal computer 1100 includes a main body 1104 provided with a keyboard 1102, and a display unit 1106 provided with a display 1108, and the display unit 1106 may be pivotally supported with respect to the main body 1104 via a hinge structure. Such a personal computer 1100 incorporates the oscillator 1.

Figure 11:
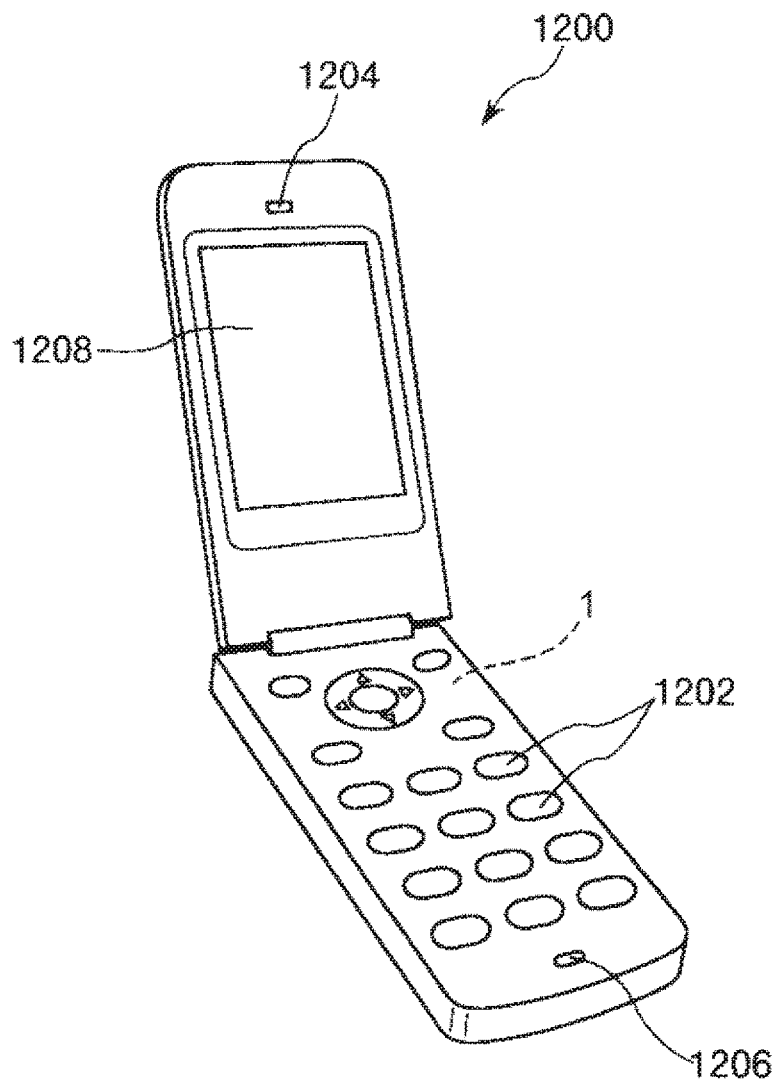
FIG. 11 is a perspective view showing a configuration of a cellular phone (including PHS).

FIG. 11 is a perspective view showing a configuration of a cellular phone (including PHS) as an embodiment of the electronic instrument according to the invention.

In this drawing, the cellular phone 1200 may be provided with an antenna (not shown), a plurality of operation buttons 1202, an ear piece 1204, and a mouthpiece 1206, and a display 1208 may be disposed between the operation buttons 1202 and the ear piece 1204. Such a cellular phone 1200 incorporates the oscillator 1.

Figure 12:
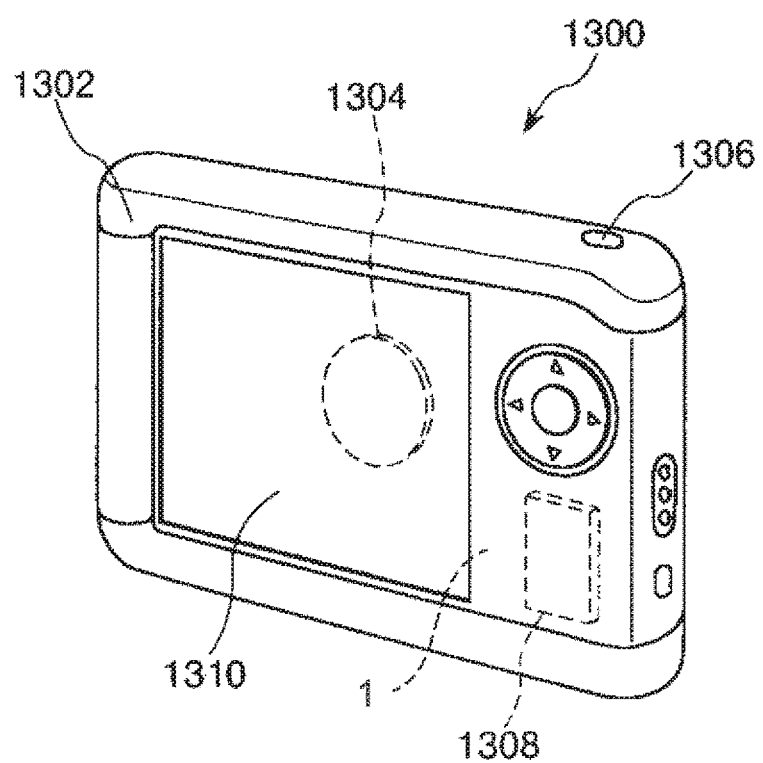
FIG. 12 is a perspective view showing a configuration of a digital still camera.

FIG. 12 is a perspective view showing a configuration of a digital still camera as the electronic apparatus according to the invention.

The case (body) 1302 of the digital still camera 1300 may be provided with a display 1310 disposed on the back surface thereof to have a configuration of performing display in accordance with the imaging signal from the CCD, wherein the display 1310 functions as a viewfinder for displaying the object as an electronic image. Further, the front surface (the back side in the drawing) of the case 1302 may be provided with a light receiving unit 1304 including an optical lens (an imaging optical system), the CCD, and so on. Then, when the photographer checks an object image displayed on the display 1310, and then presses a shutter button 1306, the imaging signal from the CCD at. that moment may be transferred to and stored in a memory 1308. Such a digital still camera 1300 incorporates the oscillator 1.

Since the electronic apparatus such as the personal computer 1100, the cellular phone 1200, or the digital still camera 1300 described above includes the oscillator 1, the electronic apparatus can obtain the advantage of the oscillator 1 described above, and can exert the excellent reliability.

It should be noted that, as the electronic apparatus according to the invention, there can be cited, for example, a smartphone, a tablet terminal, a timepiece (including a smart watch), an inkjet ejection device (e.g., an inkjet printer), a laptop personal computer that includes a hardware processor (Central Processing Unit (CPU)), a television set, a wearable terminal such as a head-mounted display (HMD), a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, a variety of types of measurement instruments, a base station apparatus for a mobile terminal, a variety of types of gauges (e.g., gauges for a vehicle, an aircraft, or a ship), a flight simulator, and a net-work server besides the personal computer shown in FIG. 10, the cellular phone shown in FIG. 11, and the digital still camera shown in FIG. 12.

Vehicle

Then, a vehicle equipped with the oscillator according to an embodiment of the disclosure will be described.

Figure 13:
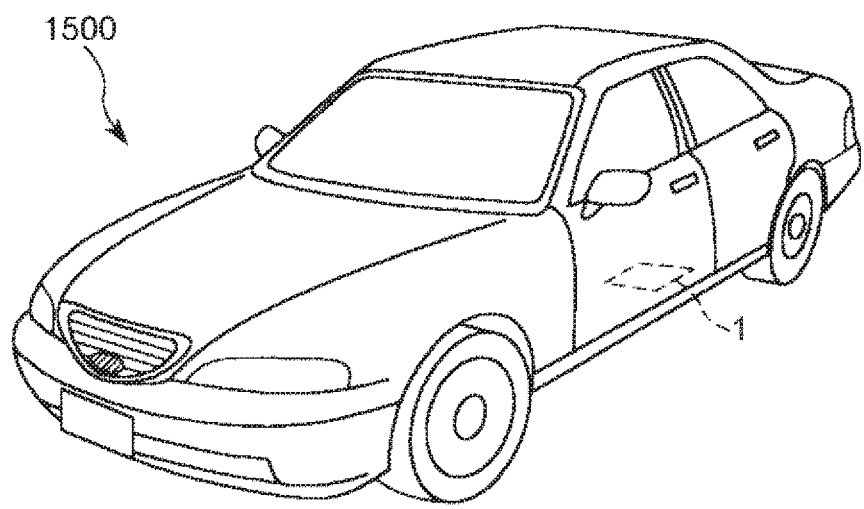
FIG. 13 is a perspective view showing a car.

FIG. 13 is a perspective view showing a car as an application of the vehicle according to the invention.

As shown in FIG. 13, the car 1500 incorporates the oscillator 1. The oscillator 1 can widely be applied to an electronic control unit (ECU) such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a vehicle posture control system.

Since such a car 1500 includes the oscillator 1, the car can obtain the advantage of the oscillator 1 described above, and can exert the excellent reliability, Although the oscillator, the electronic apparatus, and the vehicle according to the disclosure are described based on the embodiments shown in the accompanying drawings, the disclosure is not limited to these embodiments, but the configuration of each of the constituents can be replaced with those having an identical function and an arbitrary configuration. Further, it is also possible to add any other constituents to the invention.

Further, although in the present embodiment described above, there is described the configuration of using the quartz crystal resonator element as the oscillation element, the oscillation element is not limited to the quartz crystal resonator, but there can be used a piezoelectric resonator element using a substrate made of an oxide such as aluminum nitride (AlN), lithium niobate ($LiNbO_3$), lithium tantalate ($LiTaO_3$), lead zirconium titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenide (GaAs), zinc oxide (ZnO, $Zn_2O_3$), barium titanate ($BaTiO_3$), lead titanate ($PbPO_3$), sodium potassium niobate ((K, Na)$NbO_3$), bismuth ferrite ($BiFeO_3$), sodium niobate ($NaNbO_3$), bismuth titanate ($Bi_4Ti_3O_{12}$), bismuth sodium titanate ($Na_{0.5}Bi_{0.5}TiO_3$), a layered piezoelectric substrate configured stacking the piezoelectric material such as aluminum nitride or tantalum pentoxide ($Ta_2O_5$) on a glass substrate, or piezoelectric ceramics. Further, it is also possible to use a resonator element having piezoelectric element disposed on a silicon substrate. Further, the resonator element made of a quartz crystal is not limited to the SC-cut resonator element, but it is also possible to use, for example, an At-cut, a BT-cut, a Z-cut, or an LT-cut resonator element.

Further, although in the present embodiment described above, there is described the configuration in which the two first heating elements are disposed, the number of the first heating elements is not particularly limited, but can be one, or can also be three or more. Similarly, the number of the second heating elements is not particularly limited, but can be one, or can also be three or more (e.g., 5 heating elements).

What is claimed is:

1. An oscillator comprising:
    a first package;
    an oscillation element housed in the first package;
    a first temperature controller housed in the first package;
    a second package adapted to house the first package; and
    a second temperature controller disposed outside the first package, and housed in the second package, wherein
    the first package includes a first base member on which the first temperature controller and the oscillation element are mounted, and a first lid disposed on an opposite side to the first base member with respect to the first temperature controller and the oscillation element, and
    the first lid is disposed between the first base member and the second temperature controller.

2. The oscillator according to claim 1, wherein
    the first package is mounted on an internal surface of the second package via the second temperature controller.

3. The oscillator according to claim 1, wherein
    the first package further includes a sealing ring located between the first base and the first lid, and adapted to bond the first base member and the first lid to each other, and
    the sealing ring and the second temperature controller overlap each other in a planar view.

4. The oscillator according to claim 1, wherein
    the first temperature controller comprises two heating elements each disposed on respective sides opposite to each other with respect to a central part of the first package in a planar view.

5. The oscillator according to claim 4, wherein
    the oscillation element is disposed between the two heating elements of the first temperature controller in the planar view.

6. The oscillator according to claim 1, wherein
    the second temperature controller includes two heating elements each disposed on respective sides opposite to each other with respect to a central part of the first package in a planar view.

7. The oscillator according to claim 6, wherein
    the oscillation element is disposed between the two heating elements of the second temperature controller in the planar view.

8. The oscillator according to claim 4, wherein
    the second temperature controller includes two heating elements that are disposed on respective sides opposite to each other with respect to the central part of the first package in the planar view, and
    an arrangement direction of the two heating elements of the first temperature controller and an arrangement direction of the two heating elements of the second temperature controller cross each other.

9. The oscillator according to claim 8, wherein
    the oscillation element is disposed between the two heating elements of the first temperature controller, and is disposed between the two heating elements of the second temperature controller in the planar view of the first package.

10. The oscillator according to claim 1, wherein
    the first package and the second package are each airtightly sealed.

11. The oscillator according to claim 1, further comprising:
    an interconnection substrate; and
    a flexible substrate adapted to support the second package, and connected to the interconnection substrate.

12. The oscillator according to claim 11, further comprising:
    a third package adapted to house the interconnection substrate, the flexible substrate, and the second package.

13. The oscillator according to claim 12, further comprising:
a pin electrically connected to the interconnection substrate, adapted to fix the interconnection substrate to the third package, and penetrating through the third package.

14. An electronic apparatus comprising: the oscillator according to claim 1.

15. A vehicle comprising: the oscillator according to claim 1.

16. An oscillator comprising:
a resonator element;
a first temperature controller;
an internal package that houses the resonator element and the first temperature controller; and
a second temperature controller provided so as to sufficiently heat the resonator element, wherein
the internal package includes a first base member on which the first temperature controller and the resonator element are mounted, and a first lid disposed on an opposite side to the first base member with respect to the first temperature controller and the resonator element, and
the first lid is disposed between the first base member and the second temperature controller.

17. The oscillator according to claim 16, wherein
a first housing space of the internal package is in a vacuum or at least reduced-pressure state.

* * * * *